(12) United States Patent
Kaneko et al.

(10) Patent No.: US 10,986,741 B2
(45) Date of Patent: Apr. 20, 2021

(54) ELECTRONIC CONTROL DEVICE

(71) Applicant: Hitachi Automotive Systems, Ltd., Hitachinaka (JP)

(72) Inventors: Yujiro Kaneko, Hitachinaka (JP); Yoshio Kawai, Hitachinaka (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 115 days.

(21) Appl. No.: 16/464,411

(22) PCT Filed: Nov. 16, 2017

(86) PCT No.: PCT/JP2017/041258
§ 371 (c)(1),
(2) Date: May 28, 2019

(87) PCT Pub. No.: WO2018/116710
PCT Pub. Date: Jun. 28, 2018

(65) Prior Publication Data
US 2020/0344900 A1    Oct. 29, 2020

(30) Foreign Application Priority Data

Dec. 22, 2016 (JP) .............................. JP2016-248902

(51) Int. Cl.
*H05K 5/00* (2006.01)
(52) U.S. Cl.
CPC .................................. *H05K 5/0069* (2013.01)
(58) Field of Classification Search
CPC .......................... H05K 5/0069; H05K 7/20854
See application file for complete search history.

(56) References Cited

U.S. PATENT DOCUMENTS

| 5,531,950 | A | | 7/1996 | Kimura | |
|---|---|---|---|---|---|
| 5,909,915 | A | * | 6/1999 | Okuda | H05K 3/284 174/521 |
| 6,094,349 | A | * | 7/2000 | Fassel | H05K 3/284 165/80.2 |
| 7,813,134 | B2 | * | 10/2010 | Katsuro | H05K 7/20854 361/714 |

(Continued)

FOREIGN PATENT DOCUMENTS

| JP | H7-124995 A | 5/1995 |
|---|---|---|
| JP | 2001-156235 A | 6/2001 |

(Continued)

OTHER PUBLICATIONS

International Search Report with English translation and Written Opinion issued in corresponding application No. PCT/JP2017/041258 dated Jan. 16, 2018.

*Primary Examiner* — Abhishek M Rathod
(74) *Attorney, Agent, or Firm* — Foley & Lardner LLP

(57) ABSTRACT

Provided is an electronic control device that can be reduced in size and weight and can maintain high reliability even under a severe environment.

The electronic control device includes: a control substrate; a connector having one end connected to the control substrate and the other end connected to an external terminal; and a housing that covers at least the control substrate and a connecting portion on the connector with the control substrate,
in which the housing includes a resin and a metal plate, the metal plate includes a bend part at its outer peripheral portion, and the bend part is covered with the resin.

10 Claims, 9 Drawing Sheets

(56) References Cited

U.S. PATENT DOCUMENTS

| | | | | |
|---|---|---|---|---|
| 8,727,794 | B2* | 5/2014 | Tanaka | H05K 5/064 |
| | | | | 439/76.1 |
| 8,835,017 | B2* | 9/2014 | Horng | B32B 3/30 |
| | | | | 428/601 |
| 8,885,343 | B2* | 11/2014 | Lischeck | H05K 7/20854 |
| | | | | 361/715 |
| 9,491,873 | B2* | 11/2016 | Tsujino | H01L 23/057 |
| 9,661,765 | B2* | 5/2017 | Wakana | H05K 5/0056 |
| 9,713,277 | B2* | 7/2017 | Kroeckel | H05K 5/0069 |
| 9,743,539 | B2* | 8/2017 | Kajiwara | B23K 35/262 |
| 9,781,849 | B2* | 10/2017 | Negishi | H05K 5/0213 |
| 9,814,147 | B2* | 11/2017 | Igari | H05K 5/0069 |
| 9,967,993 | B1* | 5/2018 | Walker | H05K 7/1418 |
| 10,188,005 | B2* | 1/2019 | Albert | H05K 5/0043 |
| 10,462,915 | B2* | 10/2019 | Liskow | H05K 5/06 |
| 2001/0002067 | A1 | 5/2001 | Azuma | |
| 2006/0012034 | A1* | 1/2006 | Kadoya | H05K 7/20872 |
| | | | | 257/712 |
| 2008/0062038 | A1* | 3/2008 | Ouchi | H05K 7/20854 |
| | | | | 342/175 |
| 2008/0266821 | A1* | 10/2008 | Wetzel | H01L 23/047 |
| | | | | 361/757 |
| 2009/0086437 | A1* | 4/2009 | Tsuyuno | H05K 7/20454 |
| | | | | 361/709 |
| 2010/0243638 | A1* | 9/2010 | Niederer | H01R 12/58 |
| | | | | 219/542 |
| 2010/0255732 | A1* | 10/2010 | Kohmura | H01R 13/405 |
| | | | | 439/733.1 |
| 2011/0013368 | A1* | 1/2011 | Nagaike | H05K 9/0032 |
| | | | | 361/728 |
| 2015/0366086 | A1* | 12/2015 | Kajiwara | H01R 12/721 |
| | | | | 361/736 |
| 2016/0309600 | A1 | 10/2016 | Kajiwara | |
| 2018/0020558 | A1* | 1/2018 | Saito | H01R 12/716 |
| 2018/0220539 | A1* | 8/2018 | Kaneko | H05K 9/0084 |
| 2018/0354434 | A1* | 12/2018 | Kaneko | H05K 5/0056 |

FOREIGN PATENT DOCUMENTS

| | | |
|---|---|---|
| JP | 2005-142307 A | 6/2005 |
| JP | 2008-235559 A | 10/2008 |
| JP | 2015-125951 A | 7/2015 |

* cited by examiner

ELECTRONIC CONTROL DEVICE

TECHNICAL FIELD

The present invention relates to an electronic control device such as an engine control unit and an automatic transmission control unit used in an automobile, and particularly to a structure of the electronic control device.

BACKGROUND ART

With the background of environmental and energy problems, the trend of automobile electronics is accelerating, and the number of electronic control devices installed has been greatly increasing. This leads to limitation of installation space for the electronic control devices, and thus, the electronic control devices are inevitably installed in an engine compartment with severe environmental conditions compared with other locations of an automobile. On the other hand, the engine compartment has been downsized with a trend of an expanded cabin space to enhance comfortability of an automobile.

The downsized engine compartment needs to accommodate a large number of electronic control devices and their wire harnesses, leading to a difficulty in layout, an increase in weight, and increase in cost. This generates a demand for an electronic control device that is smaller, lighter, and lower in cost.

Among these issues, providing a lighter electronic control device is an important issue to be considered due to its influence on the automobile fuel efficiency and environmental problems. Exemplary measures to achieve lighter device examined in recent years include forming a housing in resin instead of metal. Using resin as the housing material makes it possible to produce a lighter electronic control device while maintaining its original housing shape.

However, in consideration of the heat dissipation of the electronic control device, the thermal conductivity of the resin is lower than the thermal conductivity of the metal, and thus, it is necessary to locally use the metal in a case where the heat dissipation performance is insufficient in the resin housing. This leads to formation of the housing of the electronic control device using a combination of resin and metal.

Examples of background technologies in this technical field include a technique described in PTL 1. PTL 1 discloses "a method of manufacturing an electronic device housing having a rib or a boss by integrally molding metal and resin, in which an adhesive is applied onto a metal and after the adhesive is dried, resin is injected from a portion constituting the rib or the boss onto a layer of adhesive to achieve composite molding".

CITATION LIST

Patent Literature

PTL 1: JP H7-124995 A

SUMMARY OF INVENTION

Technical Problem

As described above, an in-vehicle electronic control device needs to achieve performance improvement concerning the reliability of the electronic control device such as heat dissipation as well as satisfying the demands for producing the smaller and lighter device with lower cost.

The above-described PTL 1 relates to a housing of an electronic device such as a personal computer. In a case where the device is mounted in an engine compartment of an automobile, for example, the device has to be located in a harsher environment with high heat and high vibration, etc, leading to a problem of detachment of metal and resin due to the difference in linear expansion coefficients.

Accordingly, an in-vehicle electronic control device needs to ensure higher reliability. Furthermore, in order to reduce the cost, there is a need to simplify the production process of the electronic control device.

In view of these, an object of the present invention is to provide an electronic control device that can be reduced in size and weight and can maintain high reliability even under a severe environment.

Another object of the present invention is to provide a method for manufacturing an electronic control device that can achieve simplicity and low cost while maintaining the reliability of the electronic control device.

Solution to Problem

In order to solve the above-described problems, the present invention provides an electronic control device including: a control substrate; a connector having one end connected to the control substrate and the other end connected to an external terminal; and a housing that covers at least the control substrate and a connecting portion on the connector with the control substrate, in which the housing includes a resin and a metal plate, the metal plate includes a bend part at its outer peripheral portion, and the bend part is covered with the resin.

Another aspect of the present invention is an electronic control device manufacturing method including: (a) disposing a metal plate to be a portion of a housing of the electronic control device between an upper mold and a lower mold of a mold; and (b) injecting a resin material into a cavity of the mold so as to cover a bend part provided at an outer peripheral portion of the metal plate and molding a resin to be a portion of the housing of the electronic control device.

Advantageous Effects of Invention

According to the present invention, it is possible to provide a highly reliable electronic control device achieving both low cost and high productivity.

In addition, it is possible to provide an electronic control device that can be reduced in size and weight and can maintain high reliability even under a severe environment.

In addition, it is possible to implement a method for manufacturing an electronic control device that can achieve simplicity and low cost while maintaining the reliability of the electronic control device.

Problems, configurations, and effects other than in the above will become apparent by the following description in the embodiments.

DESCRIPTION OF EMBODIMENTS

Figure 1:
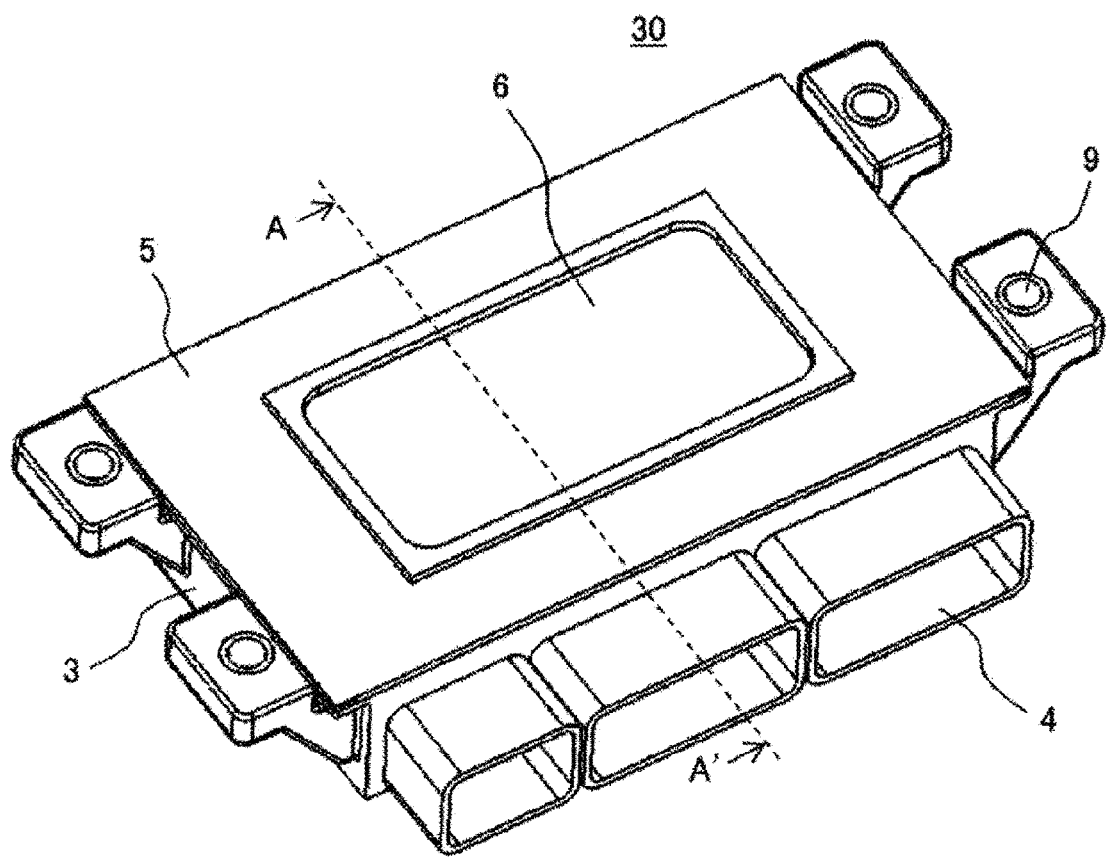
FIG. 1 is an external perspective view of an electronic control device according to an embodiment of the present invention.

Hereinafter, a configuration and an assembly procedure of an electronic control device according to specific embodiments of the present invention will be described with reference to the accompanying drawings. In each of the drawings, same components are denoted by the same reference numerals, and a detailed description will be omitted for duplicated portions.

First Exemplary Embodiment

Figure 2:
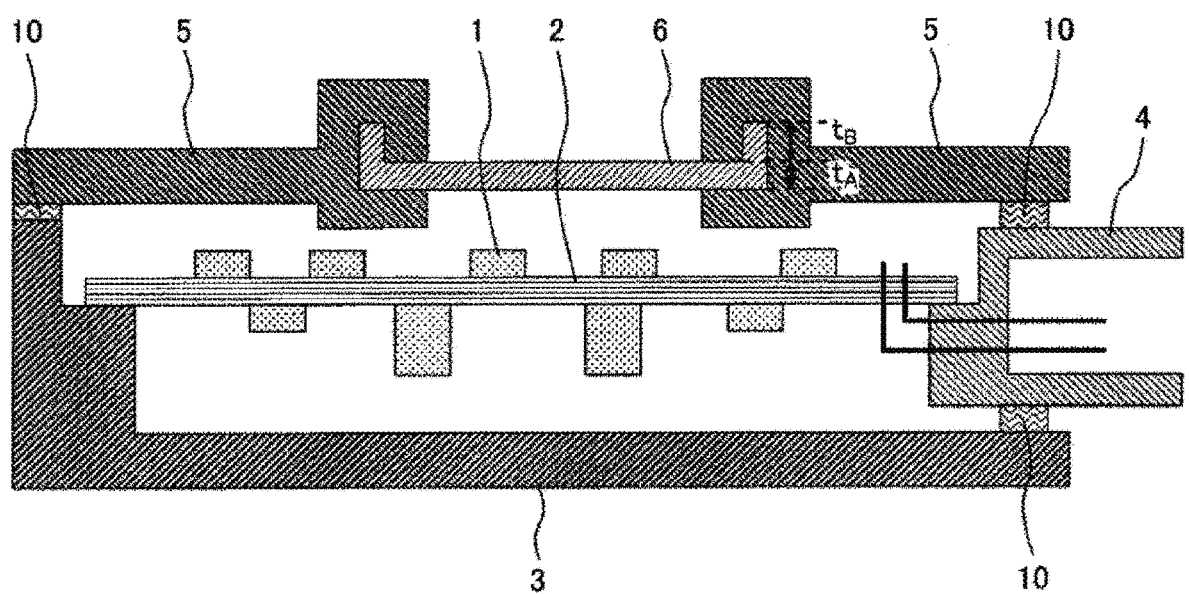
FIG. 2 is a cross-sectional view taken along line A-A' in FIG. 1.

First, an electronic control device according to the present exemplary embodiment will be described with reference to FIGS. 1 and 2. FIG. 1 is an external perspective view schematically illustrating an electronic control device 30. FIG. 2 is a A-A' cross-sectional view of the electronic control device 30 illustrated in FIG. 1. As illustrated in FIGS. 1 and 2, the electronic control device 30 of the present invention includes: a control substrate 2 on which an electronic component 1 such as a microcomputer is mounted; a connector 4; a housing case 3 formed of resin having a fixture for vehicle mounting 9; and a housing base 5 formed of resin. The reason for forming the housing case 3 and the housing base 5 with resin rather than metal is to reduce the weight of the electronic control device 30.

An end portion (one end) of the connector 4 is connected to the control substrate 2, while an opposite end (the other end) is connected to an external connection terminal (external terminal) (not illustrated). The housing case 3 and the housing base 5 constitute a housing of the electronic control device 30, and cover the control substrate 2 and a connecting portion between the connector and the control substrate 2 to protect the parts from external environment. Note that a sealant 10 is provided between the housing case 3, the connector 4, and the housing base 5 to prevent entry of moisture and dust (foreign matter) into the housing of the electronic control device 30.

The metal plate 6 is molded integrally on the housing base 5, with its outer peripheral portion buried in the housing base 5. The outer peripheral portion of the metal plate 6 buried in the housing base 5 includes a bend part. In other words, the bend part is formed on the outer peripheral portion of the metal plate 6, and the resin of the housing base 5 covers the bend part. Most of the electronic components 1 mounted on the control substrate 2 are heat generating components that generate heat when energized. The metal plate 6 functions as a heat dissipation plate to enhance heat dissipation of the resin housing.

Figure 3:
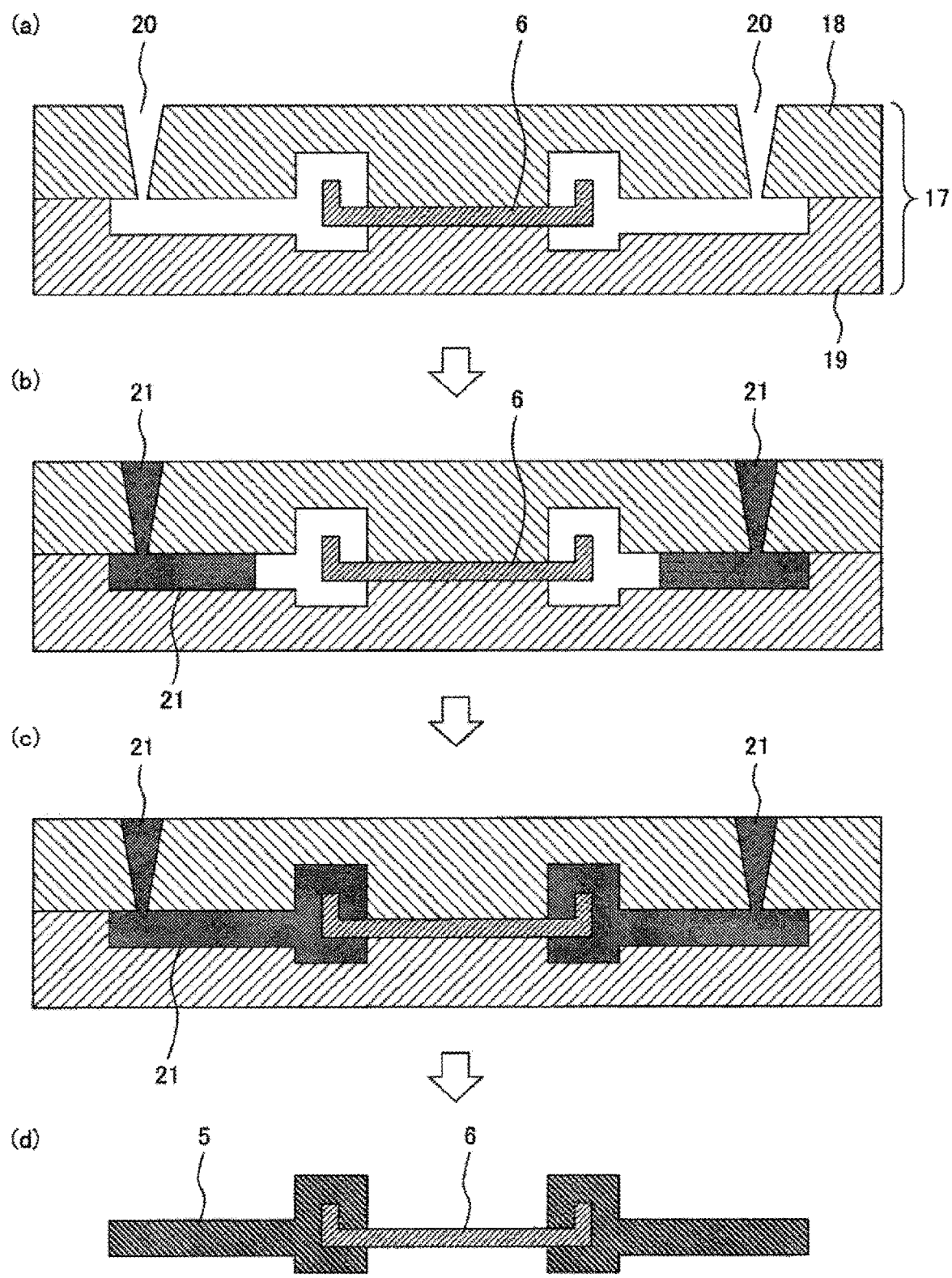
FIG. 3 is a view illustrating a portion of a manufacturing process of an electronic control device according to an embodiment of the present invention. (Configuration and assembly procedure of housing base)

Next, a manufacturing process of the housing base 5 in which the metal plate 6 is integrally formed will be described with reference to FIG. 3. Drawings (a) to (d) of FIG. 3 illustrate a configuration and an assembly procedure of the housing base 5. As illustrated in FIG. 3, the housing base 5 is integrally formed by injection molding so as to cover the outer peripheral portion of the metal plate 6 with a resin 21.

The metal plate 6 is preferably formed of a metal material having high thermal conductivity, preferably aluminum or an aluminum alloy from the viewpoints of heat dissipation, weight reduction, mass productivity, and cost. Alternatively, however, iron or iron alloy may be used from the viewpoint of heat dissipation, mass production, and cost. In order to improve adhesion between the metal plate and the resin 21, the metal plate 6 is preferably roughened or surface treated in advance. This enhances contact between the metal plate 6 and the resin 21 and thus suppresses removal of the resin 21 from the metal plate 6 by stress generated by an environmental temperature change, vibration, or the like, leading to enhancement of contact reliability.

The resin 21 may preferably be formed of resin material that is light in weight and having excellent heat resistance, such as a Poly-Butylene-Terephthalate (PBT), Poly-Amide (PA) 66, and Poly-Phenylene-Sulfide (PPS).

As illustrated in FIG. 3(a), the mold 17 used in resin molding includes a lower mold 19 and an upper mold 18. The metal plate 6 is disposed between the lower mold 19 and the upper mold 18. For the purpose of ensuring the fluidity of the resin 21 and enabling the resin 21 to fill over narrower sites inside of the mold 17, it is preferable to preheat the mold 17, the metal plate 6, and the resin 21. After completion of the preheating, the resin 21 is injected from a gate 20 of the upper mold 18 so as to flow into a hollow space (cavity) of the mold 17, as illustrated in FIG. 3(b).

Subsequently, as illustrated in FIG. 3(c), after completion of resin filling into the mold 17, the resin 21 is cooled and cured in the mold 17. After curing, the mold 17 is opened and a resin molded article is taken out. This completes molding of the housing base 5 in which the metal plate 6 is integrated, as illustrated in FIG. 3(d).

Figure 4A:
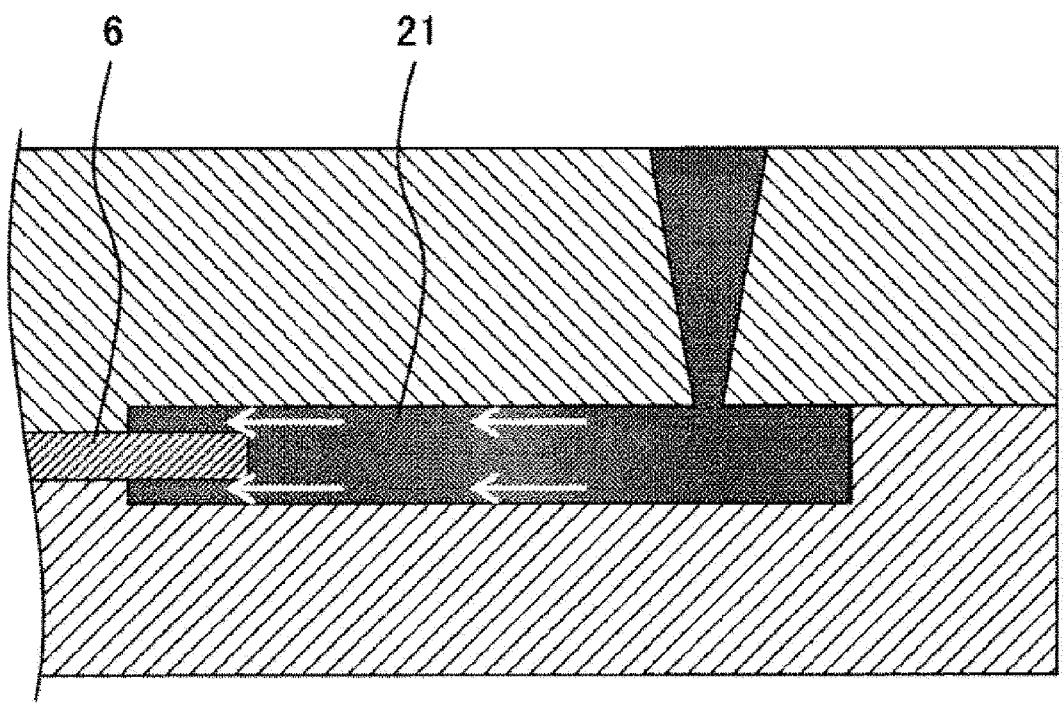
FIG. 4A is an enlarged cross-sectional view of a resin flow portion in FIG. 3. (Known electronic control device)
Figure 4B:
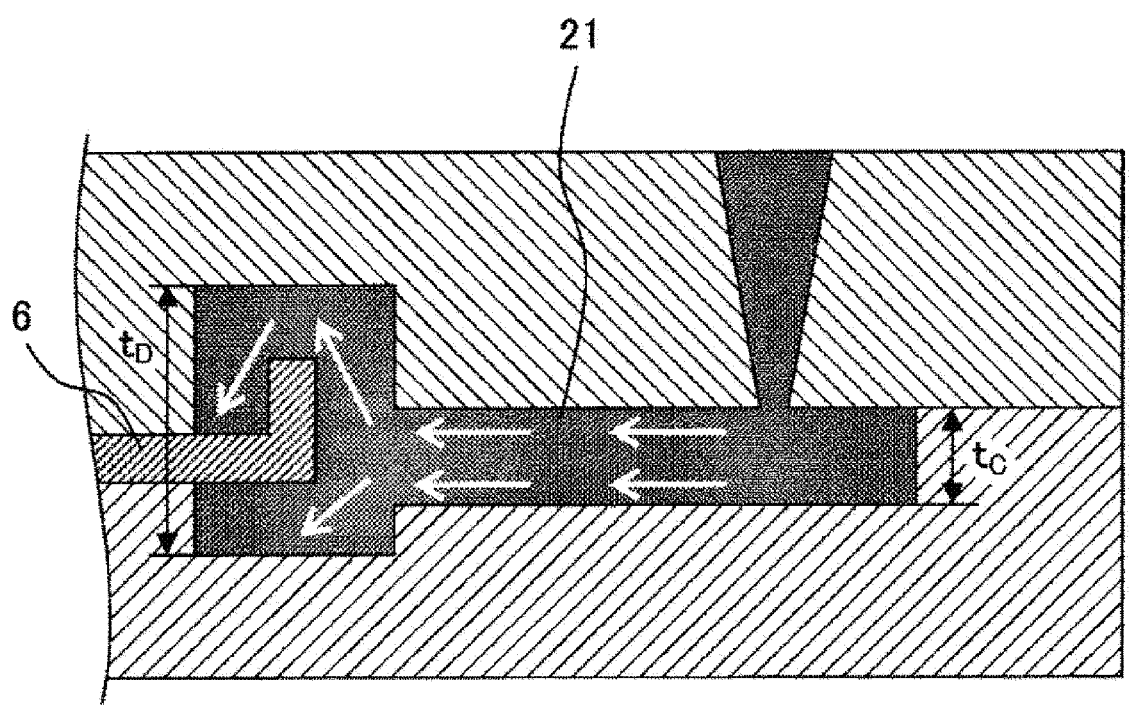
FIG. 4B is an enlarged cross-sectional view of the resin flow portion in FIG. 3. (Electronic control device of the present invention)

What is important here is that the outer peripheral portion of the metal plate 6 is bent as illustrated in the present exemplary embodiment. FIG. 4A illustrates an enlarged cross-sectional view of a case where the outer peripheral portion of the metal plate 6 is not bent, that is, the case where the resin flow portion in a known electronic control device is used. FIG. 4B illustrates an enlarged cross-sectional view of a case where the outer peripheral portion of the metal plate 6 is bent, that is, the case where the resin flow portion of the electronic control device of the present exemplary embodiment is used. Note that the open arrows in FIGS. 4A and 4B indicate the flow directions of the resin material 21.

In comparison of a length of joint between the metal plate 6 and the resin 21, the length of joint between the metal plate 6 and the resin 21 is longer in the case where the outer peripheral portion of the metal plate 6 is bent than the case where the outer peripheral portion of the metal plate 6 is not bent. Accordingly, in a case where the joint between the metal plate 6 and the resin 21 begins to be detached from each other due to the influence of mechanical shock, vibration, temperature cycle, salt spray or the like, and this detachment progresses with the lapse of time, the longer the length of joint, the longer the joint life.

Furthermore, bending the outer peripheral portion of the metal plate 6 enhances the joint area and in addition to this, the shape effect of the metal plate 6 can alleviate stress concentration on the joint between the metal and the resin occurring at the time when vibration or heat is applied to the electronic control device 30. This leads to enhancement of joint reliability between the metal plate 6 and the resin 21. Therefore, it is preferable to achieve a higher bending height ($t_B$ in FIG. 2) of the outer peripheral portion of the metal plate 6, preferably being a thickness ($t_A$ in FIG. 2) of the metal plate 6, or higher. That is, it is preferable to provide a bend part so that a relationship between the height $t_B$ of the bend part and the thickness $t_A$ of the metal plate 6 satisfies $t_B$ $t_A$.

It is preferable that the resin 21 is shaped such that a resin thickness ($t_C$ in FIG. 4B) of the region not covering the metal plate 6 becomes smaller than a resin thickness ($t_D$ in FIG. 4B) of the region covering the bend part of the outer peripheral portion of the metal plate 6. This configuration reduces the usage amount of the resin 21, leading to reduction of weight and cost of the electronic control device.

Figure 5A:
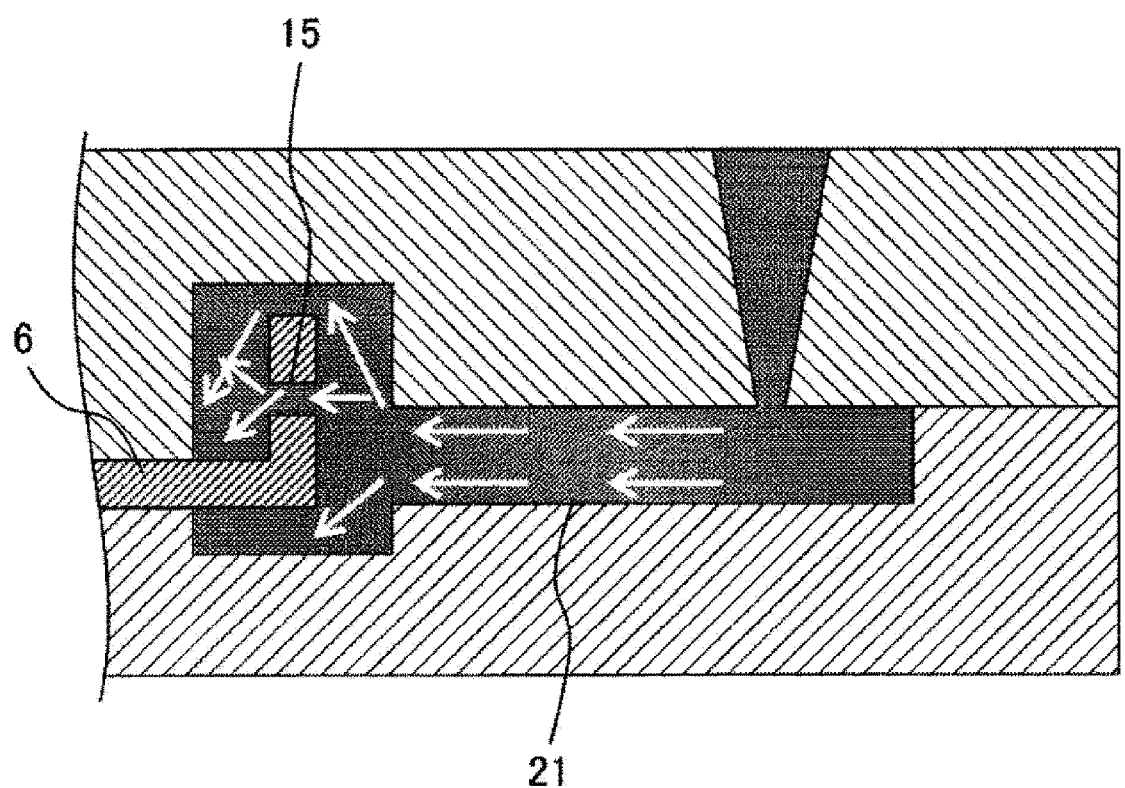
FIG. 5A is a view illustrating a modification of FIG. 4B.

In addition, as illustrated in FIG. 5A, the bend part of the outer peripheral portion of the metal plate 6 may have a through hole 15. This allows the resin material 21 to pass through the through hole 15 at the time of injection of the resin material 21 into the cavity of the mold 17, enabling enclosing the bend part of the outer peripheral portion of the metal plate 6 from all directions. This would allow the resin material 21 to further firmly adhere to the metal plate 6, leading to further improvement of the joint reliability between the metal plate 6 and the resin 21.

Figure 5B:
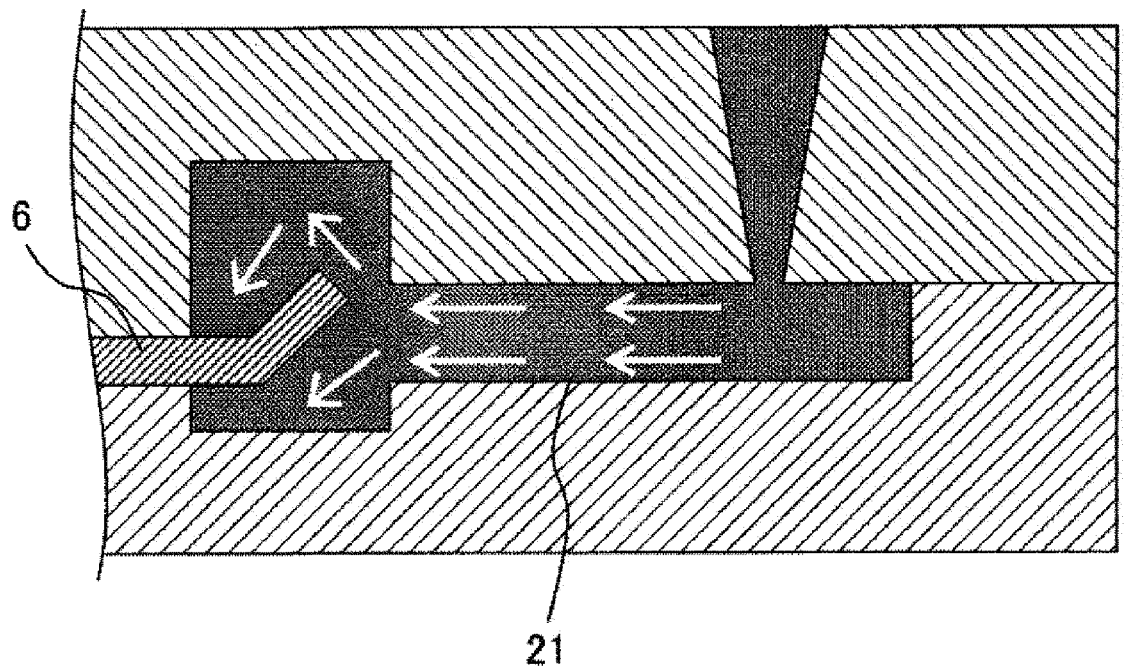
FIG. 5B is a view illustrating a modification of FIG. 4B.
Figure 6:
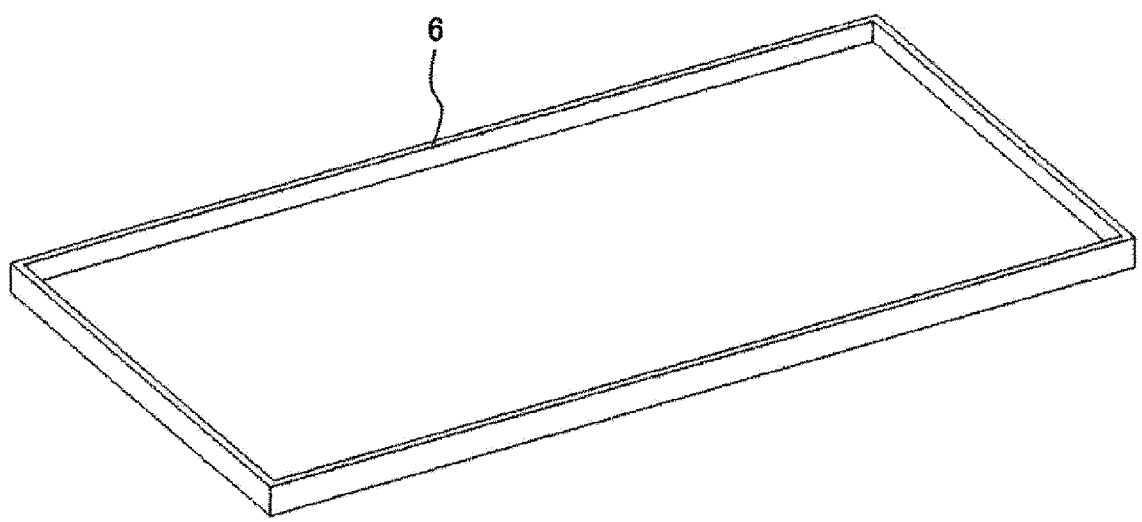
FIG. 6 is an external perspective view of a metal plate of an electronic control device according to an embodiment of the present invention.
Figure 7:
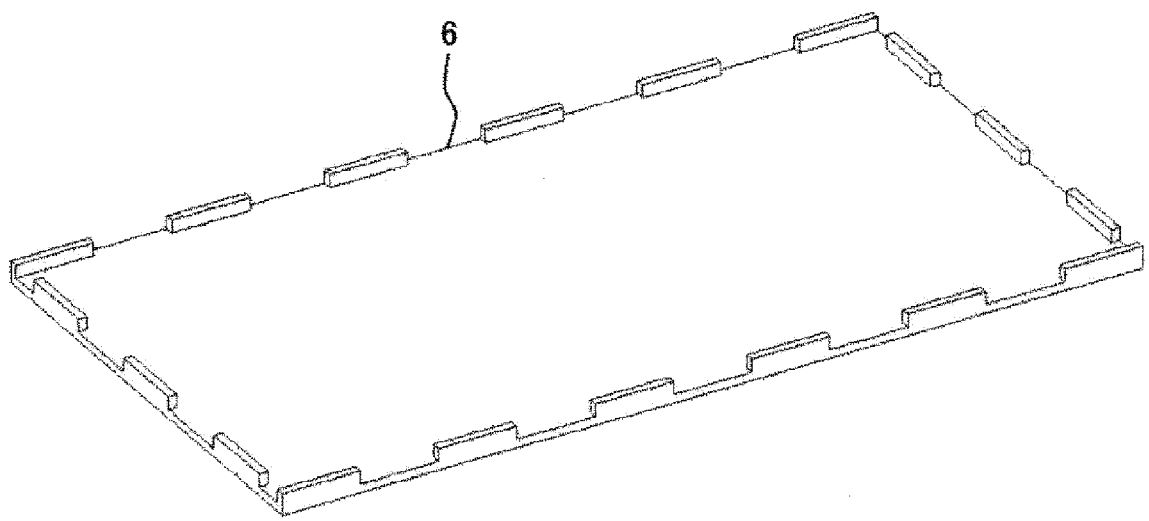
FIG. 7 is a view illustrating a modification of FIG. 6.
Figure 8:
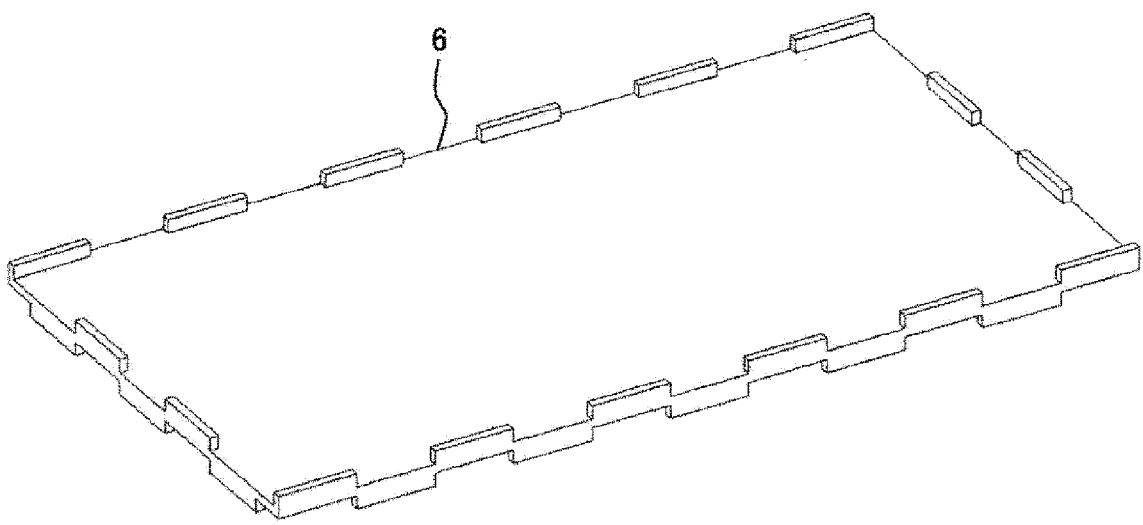
FIG. 8 is a view illustrating a modification of FIG. 6.

The band part on the outer peripheral portion of the metal plate 6 may also be inclined with respect to the metal plate 6 as illustrated in FIG. 5B, in addition to substantially vertical installation with respect to the metal plate 6 as in FIGS. 4B and 5A. Moreover, the bend part may be provided over the entire circumference of the outer peripheral portion of the metal plate 6 as illustrated in FIG. 6. The bend part may be provided intermittently along the outer periphery of the metal plate 6 as illustrated in FIG. 7, or may be alternately provided up and down along the outer periphery as illustrated in FIG. 8. In any of the shapes, the length of joint between the metal plate 6 and the resin 21 can be greater than in the case where the outer peripheral portion of the metal plate is not bent, and this also can reduce the stress generated at the joint, leading to improvement of the joint reliability between the metal plate 6 and the resin 21.

Meanwhile, as the material of the resin 21, glass fiber is preferably contained in order to improve heat resistance and strength of the resin 21. In the present exemplary embodiment, a case of using the resin 21 containing the glass fiber will be described. In the case where the outer peripheral portion of the metal plate 6 is not bent, the resin flow is as indicated in the direction of an open arrow as illustrated in FIG. 4A. In this case, the orientation of the glass fiber depends on the flow direction of the resin 21 and is aligned in one direction.

For this reason, the linear expansion coefficient of the resin is anisotropic and the resin is parallel to the direction of the glass fiber in a planar direction of the housing base 5. This reduces the linear expansion coefficient of the resin closer to the linear expansion coefficient of the metal plate 6. However, in the vertical direction of the housing base 5, the resin is perpendicular to the direction of the glass fiber, leading to a greater difference the linear expansion coefficient from the metal plate 6, compared with the case in the planar direction. This might generate a stress due to the difference in the linear expansion coefficient at the joint between the metal plate 6 and the resin 21 under the temperature cycle environment, leading to detachment between the metal plate 6 and the resin 21.

In contrast, as in the present exemplary embodiment illustrated in FIGS. 4B and 6, in a case where the outer peripheral portion of the metal plate 6 is bent and the resin thickness ($t_C$ in FIG. 4B) of the region not covering the metal plate 6 is set smaller than the resin thickness ($t_D$ in FIG. 4B) of the region covering the metal plate 6, it is possible to disturb the flow of the resin 21 and disturb the direction of the glass fiber as illustrated in the open arrow in FIG. 4B when the flow of the resin 21 reaches the bend part. This leads to suppression of the anisotropy of the linear expansion coefficient. That is, it is preferable to provide a resin material injection region (cavity) of the mold 17 so that the relation between the resin thickness $t_D$ of the region covering the metal plate 6 and the resin thickness $t_C$ of the region not covering the metal plate 6 satisfies $t_D \geq t_C$.

This makes it possible to reduce the difference in the linear expansion coefficient between the metal plate 6 and the resin 21 as compared with the case where the outer peripheral portion of the metal plate 6 illustrated in FIG. 4A is not bent, and this enables reduction of the stress that occurs at the joint of the metal plate 6 and the resin 21 by vibration or under the temperature cycle environment, leading to improvement of the joint reliability between the metal plate 6 and the resin 21.

As described above, the bending height ($t_B$ in FIG. 2) of the outer peripheral portion of the metal plate 6 is preferably the thickness of the metal plate ($t_A$ in FIG. 2) or more. This makes it possible to disturb the flow of the resin 21 and the orientation of the glass fibers, reduces the anisotropy of the linear expansion coefficient, leading to reduction of the stress generated at the joint between the metal plate 6 and the resin 21. This would also increase the length of joint between the metal plate 6 and the resin 21, enabling improvement of joint reliability.

Furthermore, it is preferable to provide the through hole 15 in the bend part as illustrated in FIG. 5A. This makes it possible to further disturb the flow of the resin 21 and the orientation of the glass fiber as indicated by the arrows, enabling suppressing the anisotropy of the linear expansion coefficient.

Furthermore, the band part on the outer peripheral portion of the metal plate 6 may also be inclined with respect to the metal plate 6 as illustrated in FIG. 5B, or may be provided intermittently as illustrated in FIG. 7, or may be alternately provided up and down as illustrated in FIG. 8. In any of the shapes, it is possible to disturb the flow of the resin 21 and the orientation of the glass fibers at resin molding and reduces the anisotropy of the linear expansion coefficient, leading to reduction of the stress generated at the joint between the metal plate 6 and the resin 21.

Figure 9:
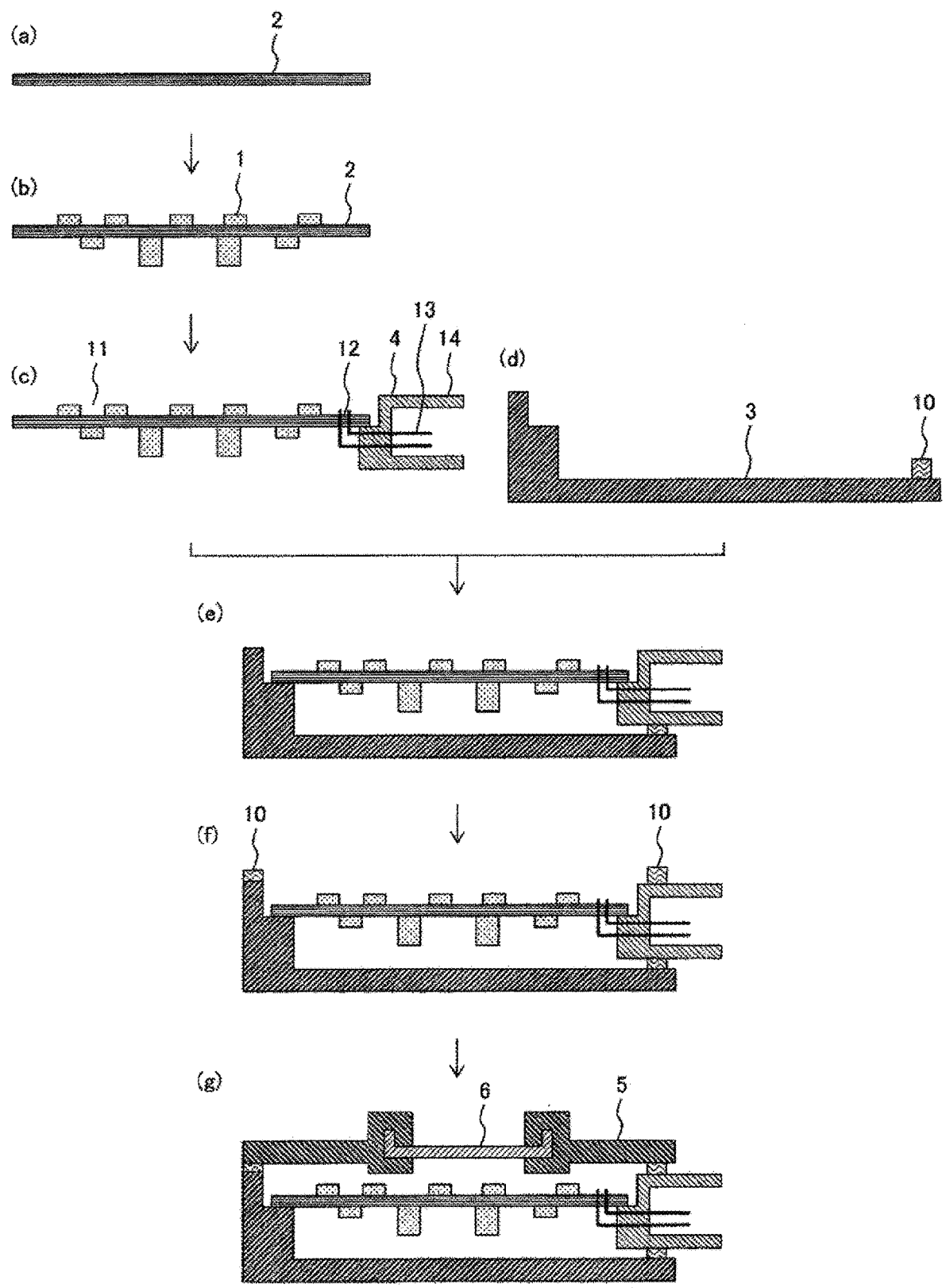
FIG. 9 is a view illustrating a portion of a manufacturing process of an electronic control device according to an embodiment of the present invention. (Configuration and assembly procedure of electronic control device)

Next, an assembly procedure of the electronic control device 30 will be described with reference to FIG. 9. As illustrated in FIGS. 9(a) and 9(b), an electronic component such as a microcomputer is mounted on the control substrate 2. A resin wiring board based on glass epoxy resin or the like is used as the control substrate 2. Connection of the electronic component 1 to the control substrate 2 uses a lead-free solder such as Sn—Cu solder, Sn—Ag—Cu solder, and Sn—Ag—Cu—Bi solder.

Subsequently, as illustrated in FIG. 9(c), the connector 4 is mounted on the control substrate 2. The connector 4 includes: a connector terminal 13 for connecting the control substrate 2 with the vehicle harness; and a connector housing 14 for aligning and holding the terminals 13 at a prescribed pitch.

The material of the connector terminal 13 may preferably be copper or a copper alloy from the viewpoint of conductivity, downsizing, and cost. Moreover, the connector housing 14 may preferably be formed of resin material that is light in weight and having excellent heat resistance, such as a Polybutylene-Terephthalate (PBT), Poly-Amide (PA) 66, and Poly-Phenylene-Sulfide (PPS). Connection between the connector terminal 13 of the connector 4 and the control substrate 2 uses a lead-free solder such as Sn—Cu solder, Sn—Ag—Cu solder, and Sn—Ag—Cu—Bi solder applied to a through hole portion 12 of the control substrate 2, into which the connector terminal 13 has been inserted. Note that the type of the connector 4 may be a surface mounting type or a press fit type.

Subsequently, as illustrated in FIG. 9(d), the sealant 10 having adhesiveness is previously applied to a portion on the housing case 3 to which the connector 4 is to be mounted, and a substrate assembly 11 in FIG. 9(c) is mounted as illustrated in FIG. 9(e).

Subsequently, as illustrated in FIG. 9(f), the sealant 10 having adhesiveness is applied to the housing case 3 and a portion on the connector 4 to which the housing base 5 is to be mounted.

Finally, as illustrated in FIG. 9(g), the housing base 5 integrally molded with the metal plate 6 is mounted and bonded to be fixed. The curing type of the sealant 10 may be either thermosetting or humidity curing. This makes it possible to prevent entry of dust (foreign matter), water, or the like, into the electronic control device 30.

Figure 10:
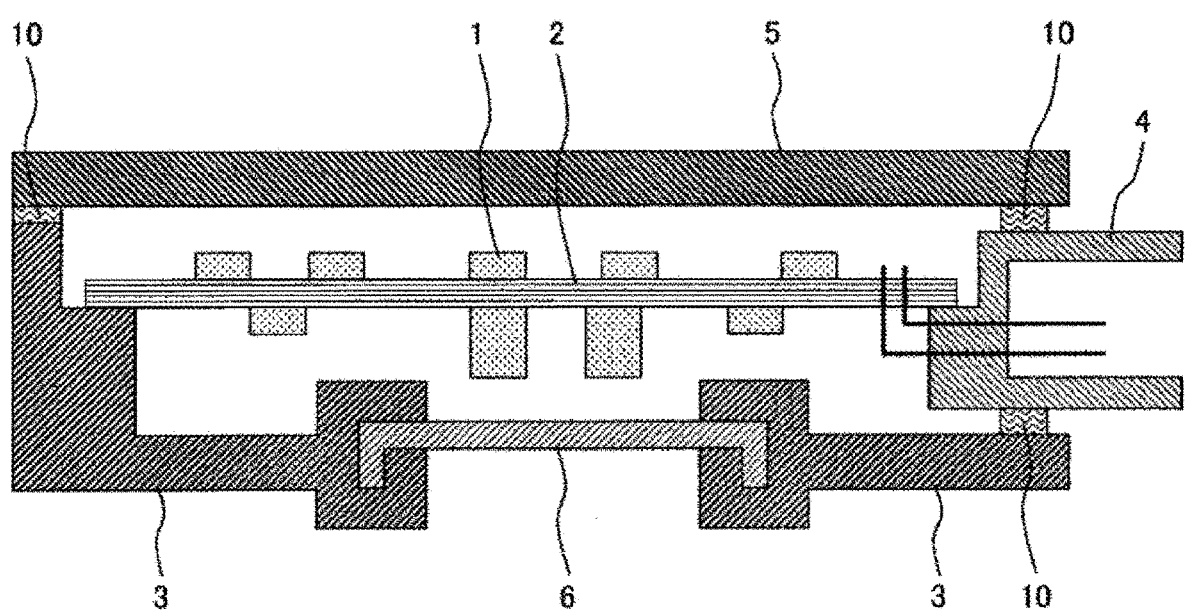
FIG. 10 is a cross-sectional view of an electronic control device according to an embodiment of the present invention. (Modification of FIG. 2)

Alternatively, the metal plate 6 may be formed integrally with the housing case 3 as illustrated in FIG. 10. It is desirable that the metal plate 6 be provided in the electronic control device 30 so as to maximize the heat dissipation effect of the electronic control device 30 by the metal plate 6 in accordance with the position of the electronic control device 30 installed in the engine compartment of the automobile.

Embodiments of the electronic control device according to the present invention have been described as above. The present invention is not limited to the above-described embodiments but may include various design modifications without departing from the spirit according to the present invention described in claims.

That is, the present invention is not limited to the above-described exemplary embodiments, but may include various types of modification. For example, the above-described exemplary embodiments give detailed explanation just to allow the present invention to be clearly understood. Therefore, the present invention is not limited to the case having all of components in the configuration. In addition, a portion of configuration of an exemplary embodiment can be replaced with a portion of configuration of another exemplary embodiment. A portion or the configuration of another exemplary embodiment can be added to a certain exemplary embodiment. Moreover, regarding the portions of the configuration of each of the exemplary embodiments, addition, deletion, and replacement from another configuration would be possible.

The present invention also has the following features.

(Note 1)
An electronic control device manufacturing method including following steps of:
(a) disposing a metal plate to be a portion of a housing of the electronic control device between an upper mold and a lower mold of a mold; and
(b) injecting a resin material into a cavity of the mold so as to cover a bend part provided at an outer peripheral portion of the metal plate and molding a resin to be a portion of the housing of the electronic control device.

(Note 2)
The electronic control device manufacturing method according to Note 1,
in which the bend part is intermittently provided along an outer periphery of the metal plate.

(Note 3)
The electronic control device manufacturing method according to Note 1,
in which the bend part is provided along an outer periphery of the metal plate, alternately in both directions of upper and lower sides of the metal plate.

(Note 4)
The electronic control device manufacturing method according to any of Notes 1 to 3,
in which the bend part has a through hole.

(Note 5)
The electronic control device manufacturing method according to any of Notes 1 to 4,
in which the bend part is inclined with respect to the metal plate.

(Note 6)
The electronic control device manufacturing method according to any of Notes 1 to 5,
in which the bend part has a height being a thickness of the metal plate or more.

(Note 7)
The electronic control device manufacturing method according to any of Notes 1 to 6,
in which the resin material contains glass fiber.

REFERENCE SIGNS LIST 1 electronic component
2 control substrate
3 housing case
4 connector
5 housing base
6 metal plate
9 fixture for vehicle mounting
10 sealant
11 substrate assembly
12 through hole portion
13 connector terminal
14 connector housing
15 through hole
17 mold
18 upper mold
19 lower mold
20 gate
21 resin (material)
30 electronic control device

The invention claimed is:
1. An electronic control device comprising:
a control substrate;
a connector having one end connected to the control substrate and the other end connected to an external terminal; and a housing that covers at least the control substrate and a connecting portion on the connector with the control substrate, wherein the housing includes a resin and a metal plate, the metal plate includes a bend part at its outer peripheral portion, and the bend part is covered with the resin, wherein the bend part is alternately provided in both directions of the outer and inner sides of the electronic control device along the outer periphery of the metal plate.

2. The electronic control device according to claim 1, wherein the bend part has a through hole.

3. The electronic control device according claim 1, wherein the bend part is inclined with respect to the metal plate.

4. The electronic control device according to claim 1, wherein the height of the bend part is a thickness of the metal plate or more.

5. The electronic control device according to claim 1, wherein a resin thickness of a region not covering the metal plate is smaller than a resin thickness of a region covering the metal plate.

6. The electronic control device according to claim 1, wherein the metal plate is formed of any of materials of aluminum, aluminum alloy, iron, or iron alloy.

7. The electronic control device according to claim 1, wherein the resin contains glass fiber.

8. The electronic control device according to claim 1, wherein anisotropy of a linear expansion coefficient of the resin is lower in the region covering the metal plate than in the region not covering the metal plate.

9. The electronic control device according to claim 1, wherein an electronic component including a heat generating component is mounted on the control substrate.

10. The electronic control device according to claim 1, wherein the metal plate is disposed on at least one of a housing case or a housing base constituting the housing.

* * * * *